(12) United States Patent
Melanson

(10) Patent No.: US 6,449,569 B1
(45) Date of Patent: Sep. 10, 2002

(54) CALIBRATION AND COMPENSATION OF DELTA SIGMA ADC'S AND DAC'S BY CORRELATING NOISE SIGNALS

(75) Inventor: John Laurence Melanson, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/457,014

(22) Filed: Dec. 8, 1999

Related U.S. Application Data

(60) Provisional application No. 60/111,814, filed on Dec. 11, 1998, and provisional application No. 60/121,206, filed on Feb. 23, 1999.

(51) Int. Cl.[7] .............................................. H03M 1/10
(52) U.S. Cl. ..................... 702/65; 341/143; 341/120; 341/118; 702/58
(58) Field of Search .................. 702/58, 65, 81, 702/82, 84, 86, 89, 90, 106, 110, 111, 191; 341/143, 118, 120; 708/313

(56) References Cited

U.S. PATENT DOCUMENTS

| | | | | |
|---|---|---|---|---|
| 4,896,155 A | * | 1/1990 | Craiglow | 341/120 |
| 4,903,023 A | * | 2/1990 | Evans et al. | 341/120 |
| 6,016,112 A | * | 1/2000 | Knudsen | 341/118 |
| 6,081,215 A | * | 6/2000 | Kost et al. | 341/120 |
| 6,271,781 B1 | * | 8/2001 | Pellon | 341/143 |

OTHER PUBLICATIONS

Sust and Goiser, "Spread Spectrum Communications Using CMOS Digital Correlators", p391–394.*
K. Nguyen, R. Adams and K. Sweetland: "A 113dB SNR Oversampling Sigma–Delta DAC for CD/DVD Application," IEEE Transactions on Consumer Electronics, vol. 44, No. 3, Aug. 1998, pp. 1019–1023, XP002133857 abstract.
J. Proakis: "Digital Communications, 3rd edition," 1995, McGraw–Hill XP002133858, pp. 234–237.
Carley, Richard L., Richard Schreier and Gabor C. Temes. "Chapter 8: Delta–Sigma ADC's with Multibit Internal Converters," *Delta–Sigma Converters: Theory, design, and Simulation*, Ed. Steven R. Norsworthy, Richard Schreier and Gabor C. Temes, IEEE Press, pp. 244–281.

* cited by examiner

*Primary Examiner*—Marc S. Hoff
*Assistant Examiner*—Paul Kim
(74) *Attorney, Agent, or Firm*—Dan A. Shifrin, Esq.

(57) ABSTRACT

The present invention correlates noise from a delta sigma modulator with noise from the same modulator passed through a nonlinear block whose purpose is to isolate the imperfection being measured. Once the imperfection is measured the results may be used to correct the output of the delta sigma modulator, to accept or reject chips or for other purposes.

21 Claims, 16 Drawing Sheets

```
#include <math.h>
#include <stdlib.h>
#include <stdio.h>

/******************************************************
 *                                                    *
 *                                                    *
 *                                                    *
 *   This program demonstrates the use of correction analysis  *
 *      for a simple 3 level delta sigma converter    *
 *                                                    *
 *   John Melanson 19 August 1998                     *
 *                                                    *
 ******************************************************/ class sim_adc{
    double i1,i2;
    int out;
    long int c1,c2,c3,d1,d2,d3;
    double e1,e2,e3,e4,e5,e6;
    long int c1e,c2e,c3e,d1e,d2e,d3e;
    double e1e,e2e,e3e,e4e,e5e,e6e;
public:
    void reset (){
        i1=0.;
        i2=0.;
        out=1;
        c1=c2=c3=0;
        d1=d2=d3=0;
        e1=e2=e3=e4=e5=e6=0.;
        c1e=c2e=c3e=0;
        d1e=d2e=d3e=0;
        e1e=e2e=e3e=e4e=e5e=e6e=0.;
    } void run(
```

FIGURE 12A

```
    double *dx,        // output of "normal" decimation channel
    double *de,        // output of "error" decimation channel
    int count,         // how many samples to output
    double in_dc,      // input dc value
    double *fb,        // feedback levels
    int dec            // decimation ratio, must be even
){ double comb_out;
int dec2=dec/2;
for(int samp=0;samp<count+50;samp++){
    for (int dl2=0;dl2<2;dl2++){
        for (int dl1=0;dl1<dec2;dl1++){
            //
            // run the simulation of the analog integrators
            //
            i1+==in_dc-fb[out];
            i2+==i1-fb[out];
            double t=i2+(double)rand()/RAND_MAX;
            out= (t<0) ? 0 : ( (t<1)?1:2);
            //
            // regular signal path comb filter
            c1+==out-1;c2+==c1;c3+==c2;
            // error signal path comb filter, only +1
            c1e+= ?out==2) ; c2e+=c1e ; c3e+=c2e;
        }
        //
        // regular signal path decimator
        long t1=c3-d1;d1=c3;
        long t2=t1-d2;d2=t1;
        long t3=t2-d3;d3=t2;
        comb_out=(double)t3/(double)(dec2*dec2*dec2);
        if(dl2 == 0){
            double temp=e1+.361*(comb_out-e2);
            e3=e2+.877*(temp-e3);
            e1=comb_out;
```

FIGURE 12B

```
            e2=temp;
        }else{
            double temp=e4+.109*(comb_out-e5);
            e6=e5+.633*(temp-e6);
            e4=comb_out;
            e5=temp;
        }
        //
        // error signal path decimator
        long t1e=c3e-d1e;d1e=c3e;
        long t2e=t1e-d2e;d2e=t1e;
        long t3e=t2e-d3e;d3e=t2e;
        comb_out=(double)t3e/(double)(dec2*dec2*dec2);
        if(dl2 == 0){
            double temp=e1e+.361*(comb_out-e2e);
            e3e=e2e+.877*(temp-e3e);
            e1e=comb_out;
            e2e=temp;
        }else{
            double temp=e4e+.109*(comb_out-e5e);
            e6e=e5e+.633*(temp-e6e);
            e4e=comb_out;
            e5e=temp;
        }

}
    //put data into output arrays
    if(samp>=50){
        dx[samp-50]=.5*(e3+e6);
        de[samp-50]=.5*(e3e+e6e);
    }
   }
  }
 }
};
void main(){
#define tlen 20000
```

FIGURE 12C

```
FILE *result;
double dx[tlen],de[tlen];
double window[tlen];
double fb[3];
double sum;
int i;
sim_adc ds;

result = fopen( "result.out", "w" );
// make a window
for(i=0;i<tlen;i++)window[i]=.5*(1-cos(2.*3.14159265359*(float)i/tlen));

// run several test cases, all with various errors
for(int pass = -5;pass<=5;pass++){
    double actual_err=.01*pass;
    fb[0]=-1.;fb[1]=0.;fb[2]=1.o+actual_err;
    // do actual simulation, collect data into dx and de
    ds.reset();
    ds.run(dx,de,tlen,.1,fb,128);

// remove mean of de
    sum=0;for(i=0;i<tlen;i++)sum+=de[i];
    double meane=sum/tlen;
    for(i=0;i<tlen;i++)de[i] -= meane;

// remove mean of dx
    // not strictly needed, but nicer to look at data
    sum=0;for(i=0;i<tlen;i++)sum+=dx[i];
    double mean=sum/tlen;
    for(i=0;i<tlen;i++)dx[i] -= mean;

// window the data
    for(i=0;i<tlen;i++){dx[i] *=window[i];de[i] *= window[i];}
```

FIGURE 12D

```
// Make cross and auto corrolations double crossc=0.,autoc=0.;
for(i=0;i<tlen;i++){
    crossc += dx[i]*de[i];
    autoc += de[i]*de[i];
}

// calculate error of feedback
double est_err = -crossc/autoc;
    fprintf(result,"actual and estimated error in feedback = %10.6f %10.6
f\n",actual_err,est_err);
    }
    fprintf(result,"end\n");
}
``` actual and estimated error in feedback =  -0.050000  -0.050041
actual and estimated error in feedback =  -0.040000  -0.040027
actual and estimated error in feedback =  -0.030000  -0.030021
actual and estimated error in feedback =  -0.020000  -0.020028
actual and estimated error in feedback =  -0.010000  -0.010016
actual and estimated error in feedback =   0.000000   0.000044
actual and estimated error in feedback =   0.010000   0.009991
actual and estimated error in feedback =   0.020000   0.019982
actual and estimated error in feedback =   0.030000   0.029982
actual and estimated error in feedback =   0.040000   0.039988
actual and estimated error in feedback =   0.050000   0.049995
end

CALIBRATION AND COMPENSATION OF DELTA SIGMA ADC'S AND DAC'S BY CORRELATING NOISE SIGNALS

This application claims the benefit of U.S. Provisional Application No. 60/111,814, filed Dec. 11, 1998, and U.S. Provisional Application No. 60/121,206, filed Feb. 23, 1999.

BACKGROUND OF THE INVENTION

1. Field of the Invention

The present invention relates to apparatus and methods for calibrating and compensating Delta Sigma ADCs and DACs by correlating noise signals.

2. Description of the Prior Art

FIG. 1 (prior art) shows a stereo analog to digital converter (ADC) comprising two delta sigma ADC's 104, 110 followed by decimation and filtering blocks 106, 112. In typical stereo systems the input signals are a right signal 102 and a left signal 108. It is known in the art to attempt to compensate for some imperfection in one or both of the delta sigma DAC's by inserting a correction block 114. In conventional systems the correction done by block 114 is measured by inputting a carefully controlled input test signal and measuring the output signal. If the input signal is unstable or the environment is noisy, the correction is inaccurate.

Delta sigma converters are subject to intersymbol interference (ISI), mismatched levels (in the case of multilevel quantization) mismatched components, and various other hardware based imperfections that limit their accuracy and vary from converter to converter. In general, it is much cheaper to correct errors in digital hardware than in analog. Past efforts to measure and correct errors of this sort have focused on measuring signal levels given a carefully controlled input test signal. A need remain in the art for apparatus and methods for calibrating and compensating Delta Sigma ADC's and DAC's by correlating noise signals.

SUMMARY OF THE INVENTION

The present invention correlates noise from a delta sigma converter with noise from the same converter passed through a nonlinear block whose purpose is to isolate the imperfection being measured. Once the imperfection is measured the results may be used to correct the output of the delta sigma modulator, to accept or reject chips or for other purposes.

Apparatus according to the present invention for measuring circuit imperfections in an analog to digital converter (ADC) having a delta sigma modulator comprises a first decimator connected to the output of the modulator, a nonlinear test element connected to the output of the modulator, for applying a nonlinear function to the output of the modulator, a second decimator matched to the first decimator and connected to the output of the nonlinear element, a correlator connected to the output of the first decimator and the output of the second decimator, and means for applying a test signal to the ADC. The correlator performs a correlation between the output of the first decimator and the output of the second decimator in the presence of the test signal and generates a circuit error signal based upon the correlation. The apparatus may also include means for applying a correction factor, based upon the circuit error signal, to the output of the ADC as the ADC operates in real time with a realtime input signal.

The correction factor may be applied by trimming a circuit element in the ADC, by placing a correction block connected between the modulator and the first decimation filter for correcting the output of the ADC according to the circuit error signal.

This apparatus may be used to measure intersymbol interference. In this case, the nonlinear element outputs a predetermined signal only when the output of the modulator, in the presence of the test signal, supplies a predetermined pattern. Or, in the case where the delta sigma modulator is multilevel and includes a digital to analog converter (DAC) in the feedback path, the apparatus can be used to measure mismatch in components associated with each level in the DAC. A swap control element in the DAC selectively swaps elements in the DAC associated with each level in order to test all of the levels.

Apparatus according to the present invention may also be used to for measure circuit imperfections in a stereo (or more channel) analog to digital converter (ADC) including at least two analog delta sigma modulators connected to inputs of the ADC. In this case the apparatus comprises a first decimator connected to the output of the first modulator, a nonlinear test element connected to the output of the first modulator, for applying a nonlinear function to the output of the first modulator, a second decimator matched to the first decimator and connected to the output of the nonlinear element, a correlator connected to the output of the first decimator and the output of the second decimator, and means for applying a test signal to the ADC. Again, the correlator performs a correlation between the output of the first decimator and the output of the second decimator in the presence of the test signal and generates a circuit error signal based upon the correlation. In the case where a correction factor, based upon the circuit error signal, is applied to an output of the ADC in real time, the nonlinear element is disabled (for example by removing its connection to the second decimator) and the second decimator is connected to the output of the second modulator.

Apparatus according to the present invention for measuring circuit imperfections in a MASH ADC including a set of delta sigma modulators comprises a first set of filter elements, one of the first set connected to the output of each modulator, means for combining outputs of the first set of filter elements to form a first filtered output, a plurality of nonlinear test elements, one of the test elements connected to the output of each modulator, for applying a nonlinear function to the output of that modulator, a second set of filter elements matched to the first set of filter elements, one of the second set connected to the output of each nonlinear element, means for combining outputs of the second set of filter elements to form a second filtered output, a correlator connected to the output of the first means for combining outputs and the second means for combining outputs, and means for applying a test signal to the MASH. The correlator performs a correlation between the first filtered output and the second filtered output in the presence of the test signal, and generates a circuit error signal based upon the correlation. The apparatus may include means for applying a correction factor, based upon the circuit error signal, to the output of the MASH in the presence of a real time input signal to the input of the MASH.

In a stereo (or more channel) MASH ADC including a two sets of delta sigma modulators, when the correction factor is applied, the nonlinear elements and disabled and each of the second set of filter elements is connected to one of the second set of delta sigma modulators.

Apparatus according to the present invention for measuring circuit imperfections in a delta sigma digital to analog converter (DAC) including a digital delta sigma modulator comprises a first simple DAC connected to the output of the modulator, a nonlinear test element connected to the output of the modulator, for applying a nonlinear function to the output of the modulator, a second simple DAC matched to the first simple DAC and connected to the output of the nonlinear element, a correlator connected to the output of the first simple DAC and the output of the second simple DAC, and means for applying a test signal to the DAC. The correlator performs a correlation between the output of the first simple DAC and the output of the second simple DAC in the presence of the test signal and generates a circuit error signal based upon the correlation. A correction factor based upon the circuit error signal may be applied to the output of the delta sigma DAC in real time.

The correction factor may be applied by trimming a circuit element the first simple DAC, or by adjusting the feedback path of the delta sigma modulator. The simple DACs might be PWMs or 1-bit DACs.

This apparatus may be used to measure intersymbol interference, by having the nonlinear element output a predetermined signal only when the output of the delta sigma DAC in the presence of the test signal supplies a predetermined pattern.

Similar apparatus may be used for measuring circuit imperfections in a stereo (or more channel) delta sigma digital to analog converter (DAC) including at least two digital delta sigma modulators connected to inputs of the delta sigma DAC. In the case where a correction factor, based upon the circuit error signal, is applied to an output of the DAC in real time, the nonlinear element is disabled (for example by removing its connection to the second simple DAC) and the second simple DAC is connected to the output of the second modulator.

A method according to the present invention of measuring circuit imperfections in a delta sigma digital to analog converter (DAC) including a digital delta sigma modulator includes the steps of applying a nonlinear function to the output of the modulator, performing a correlation between the output of the DAC and the output of the DAC after the nonlinear function is applied, and generating a circuit error signal based upon the correlation. The step of correcting the output of the DAC according to the circuit error signal may be added.

In this method, the test signal may be a signal out of the frequency of interest of the DAC, and the steps of generating a circuit error signal and correcting the output of the DAC can then be repeated as the DAC operates.

Or, the step of generating the circuit error signal may be performed once, or at selected times, and the step of correcting the output of the DAC according to the circuit error signal occurs as the DAC operates.

A similar method may be used to measure circuit imperfections in a delta sigma analog to digital converter (ADC) including an analog delta sigma modulator. The steps are applying a nonlinear function to the output of the modulator, performing a correlation between the output of the modulator and the output of the modulator after the nonlinear function is applied, and generating a circuit error signal based upon the correlation. Again the step of correcting the output of the ADC according to the circuit error signal may be added. If the test signal is a signal out of the frequency of interest of the ADC, the steps of generating a circuit error signal and correcting the output of the ADC can be repeated as the ADC operates. Or, the step of generating the circuit error signal can be performed once, or at selected times, and the step of correcting the output of the ADC according to the circuit error signal occurs as the ADC operates.

BRIEF DESCRIPTION OF THE DRAWINGS

FIG. 12 is a simulation program illustrating the calibration and compensation method of the present invention.

DETAILED DESCRIPTION OF THE PREFERRED EMBODIMENT

Figure 1:
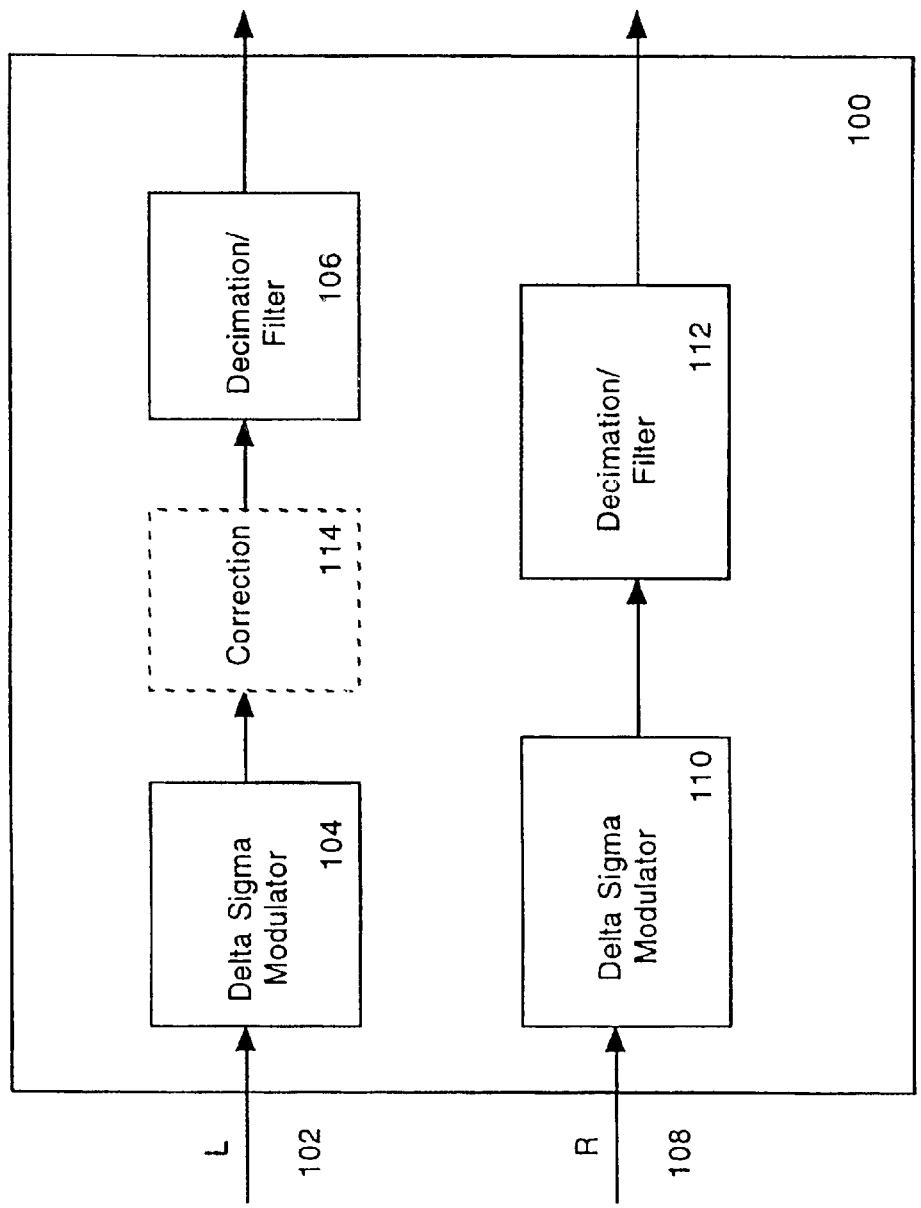
FIG. 1 (prior art) shows a block diagram of a conventional stereo analog to digital converter (ADC) utilizing two delta sigma ADC's and including conventional correction of one of the delta sigma ADC's.
Figure 2:
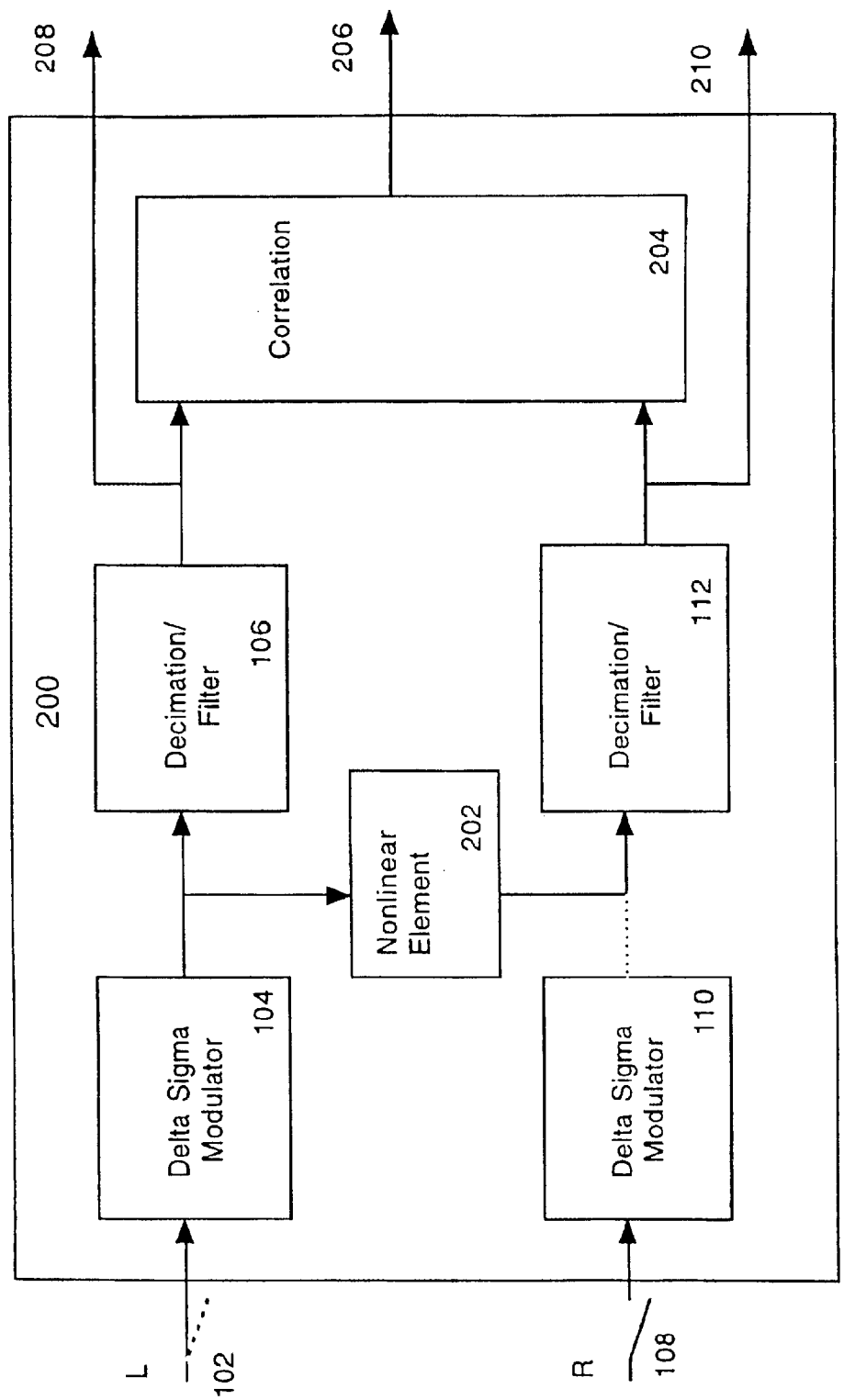
FIG. 2 shows a block diagram of a generalized stereo ADC according to the present invention including a nonlinear test element in one path and correlation of the noise through the usual path and through the nonlinear element.

FIG. 2 shows a block diagram of a generalized stereo ADC 200 according to the present invention including a nonlinear test element 202 in one path and correlation of the noise through the usual path and through the nonlinear element. In a stereo system such as that shown in FIG. 2, the second path including decimation and filtering 112 is available for use during the error measurement phase, as shown. In a non stereo system, the circuitry for the second path (after ADC 110) must be added to the chip.

In error measurement mode shown in FIG. 2, a test signal is applied to delta sigma modulator 104. The most convenient test signal is to tie this input to ground, but a DC signal or a more complicated test signal may also be used. The output of modulator 104 passes through decimation and filtering 106 to correlation block 204. The output of modulator 104 also passes through nonlinear element 202, which is designed to isolate the error source being measured. The output of nonlinear element 202 then passes through decimation and filtering circuitry 112, identical to circuitry 106, to correlation block 204. Correlation block 204 correlates the two signal to determine the magnitude of the error.

One example of a common error which may be measured by this technique is intersymbol interference. An example of intersymbol interference is that commonly a 1 following a 1 has a different energy than a 1 following a zero. To measure this error, nonlinear block 202 would output a 1 only when a 1 followed a 1. In all other cases the output would be a zero. Thus, if the output of modulator 104 is:

1 0 0 1 1 0 0 1 0 1 1 1 then the output of element 202 is:

0 0 0 0 1 0 0 0, 0 1 1.

The correlation between these two signals is the error e, which is typically small (e.g. 0.01 to 0.00001).

Obviously, to test the second delta sigma modulator 110, the signal from that block is input to the nonlinear block 202 as well as to block 112, and the output of the two filter decimation blocks 106, 110 is correlated.

In real time, given real time input signals 102 and/or 108, signals 208 and/or 210 are the ADC ouput signals.

Figure 3:
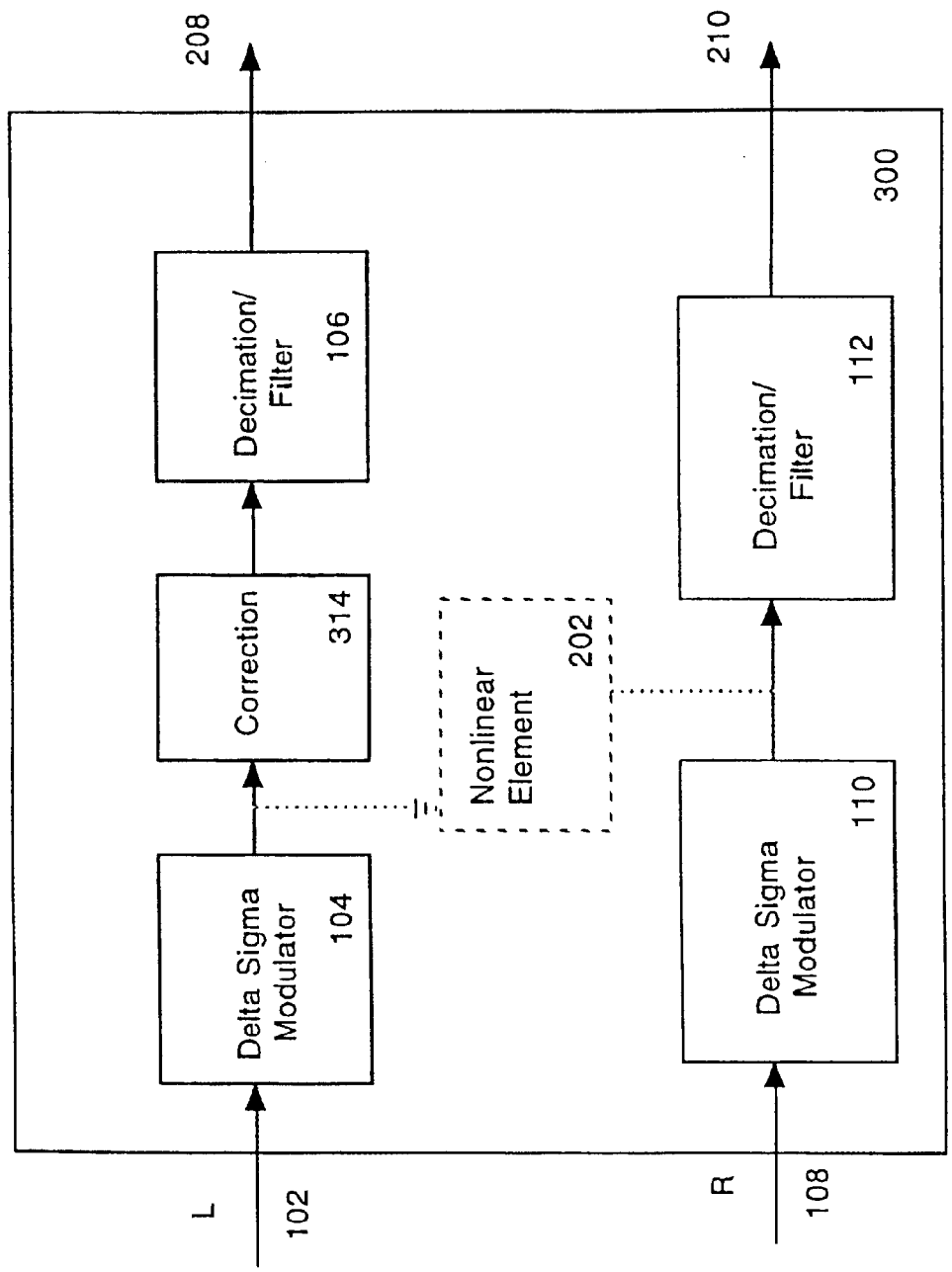
FIG. 3 shows a block diagram of the ADC of FIG. 2, further including compensation according to the present invention.

FIG. 3 shows a block diagram of the ADC 200 of FIG. 2, further including compensation 314 according to the present invention. The correction factors to be applied by correction block 314 are computed from the error signal measured as shown in FIG. 2. For example, in the ISI case described above, the correction is as follows: if a 0 is seen, a 0 is applied to the decimation filter. If a 1 following a 0 is seen, a 1 is applied. If a 1 following a 1 is seen, 1+e is applied to decimation filter block 106 (where e is the small error value calculated as described above).

While the correction of the ADC error by block 314 is simple to show and describe, it is not necessarily the best or most efficient way to correct the error. It may make more sense to trim a component in modulator 104, or to correct the feedback signal. Correction block 314 works particularly well for real time correction, for example if the error is measured in real time or upon power up, rather than being measured and corrected for once when the chip is manufactured. In the case where the ADC is stereo (or more channels) nonlinear element 202 must be disabled, for example by removing the connection to decimator 112, and modulator 110 must be connected to decimator 112. In the mono case modulator 110 is not present and nonlinear element 202 can be ignored.

Figure 4:
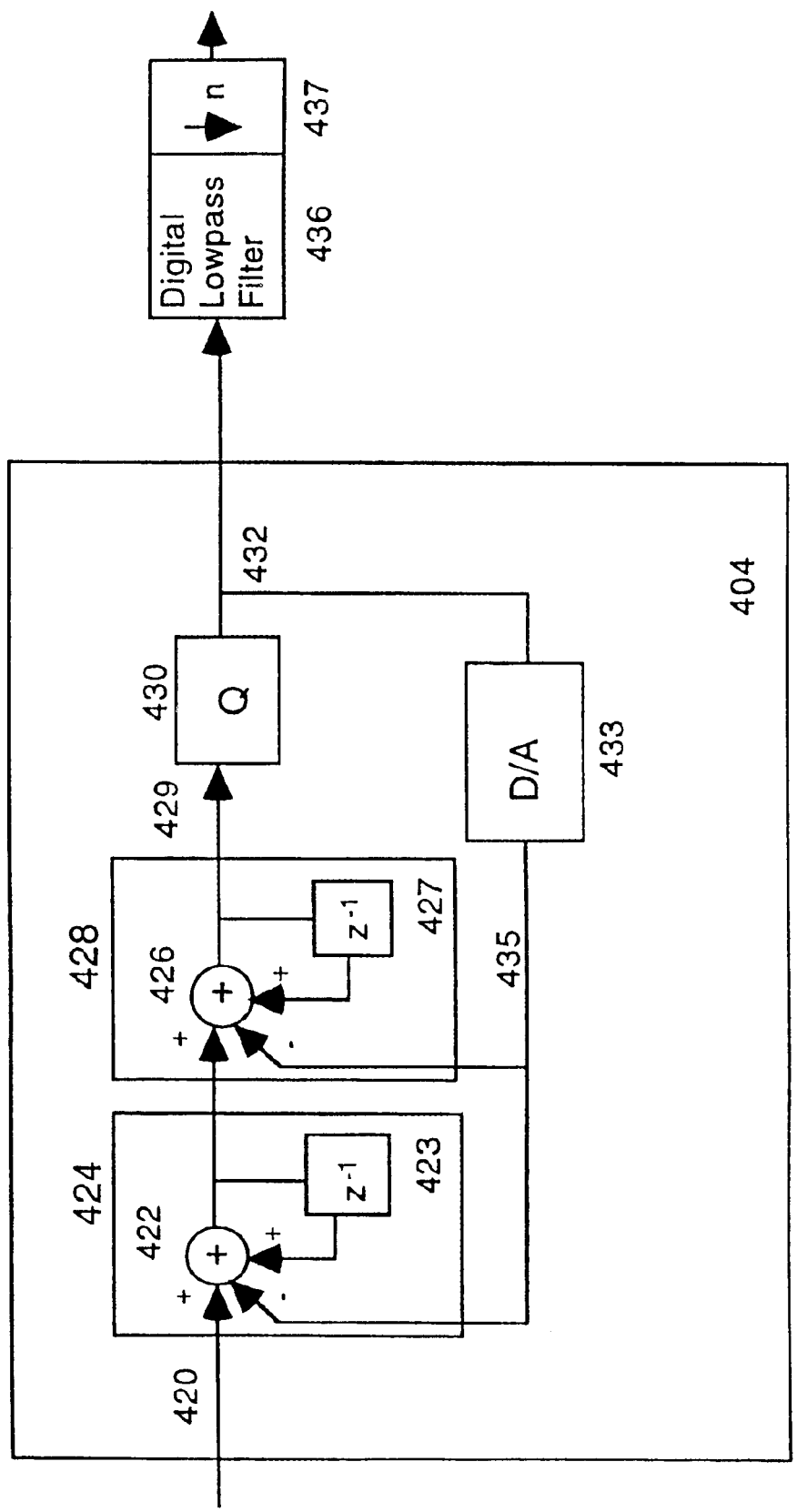
FIG. 4 (prior art) shows a block diagram of a conventional multilevel ADC.

FIG. 4 (prior art) shows a block diagram of a conventional multilevel ADC. The ADC of FIG. 4 includes a second order delta sigma A/D converter having a multilevel quantizer 430. Analog input signal 420 is added to feedback signal 435 as well as to the previous output of adder 422, delayed by delay 423. Adder 422 and delay 423 comprise integrator 424. The output of integrator 424 enters integrator 428, where it is added to the feedback signal 435 and the previous output of adder 426, delayed by delay 427. The output 429 is quantized by multilevel quantizer 430, forming the digital output signal 432, as well as the input signal to D/A converter 433. D/A converter 433 converts digital signal 432 into analog feedback signal 435, which is fed into integrators 424 and 428.

Digital output signal 432 is filtered by low pass filter 436 to remove the out of band noise from quantizer 430. Decimator 437 then outputs a signal at an appropriate sample rate for the system. The ratio between the sample rate of the integrators and the output sample rate is called the oversample ratio, or OSR. The OSR will typically be from 32 to 256.

Figure 5:
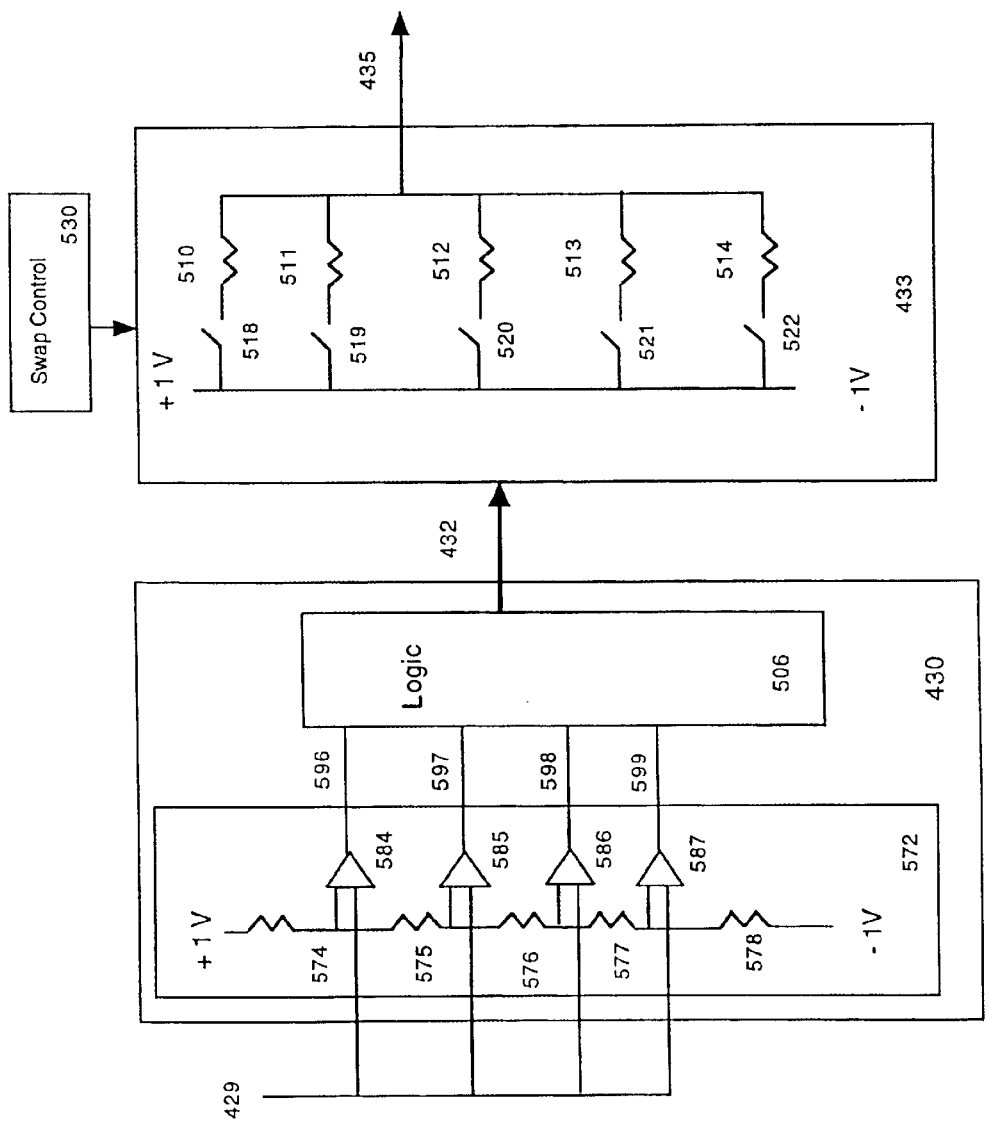
FIG. 5 shows a detailed diagram of the feedback digital to analog converter (DAC) of FIG. 4, modified according to the present invention for measuring the imperfections in the feedback DAC.

In addition to intersymbol interference (as described above) multilevel quantizers are subject to errors resulting from mismatched levels. Components in DAC 433 are never perfectly matched, and it is very difficult to measure the mismatch between them and correct for it. FIG. 2 still shows accurately how the error is measured from a top level point of view. FIG. 5 shows how a single input test signal (such as tying input to ground) may be used to test all of the levels of the quantizer.

FIG. 5 illustrates a method according to the present invention for measuring the imperfections in the elements of DAC 433 of FIG. 4 (shown here with a five level quantizer 430). Normally an input 420 tied to ground would generate an input signal 429 resulting in the use of only two or three of the components of quantizer 430. FIG. 5 shows that the resistors 510–514 may be swapped in and out so that each is tested in relation the others. Swap control element 530 swaps the resistors in and out. While resistors 510–514 are shown and described as easy to illustrate examples of elements in DAC 433, in practice switched capacitors or current sources are commonly used in place of the resistors. Those skilled in the art will appreciate that this functionality can be implemented in a number of ways.

To correct mismatch, one or more of the resistors or other elements may be trimmed or adjusted (or fuses may be blown or other one time measures to modify the operation of the elements may be implemented). Or, a run time correction block may be used as described in conjunction with FIG. 3.

Figure 6:
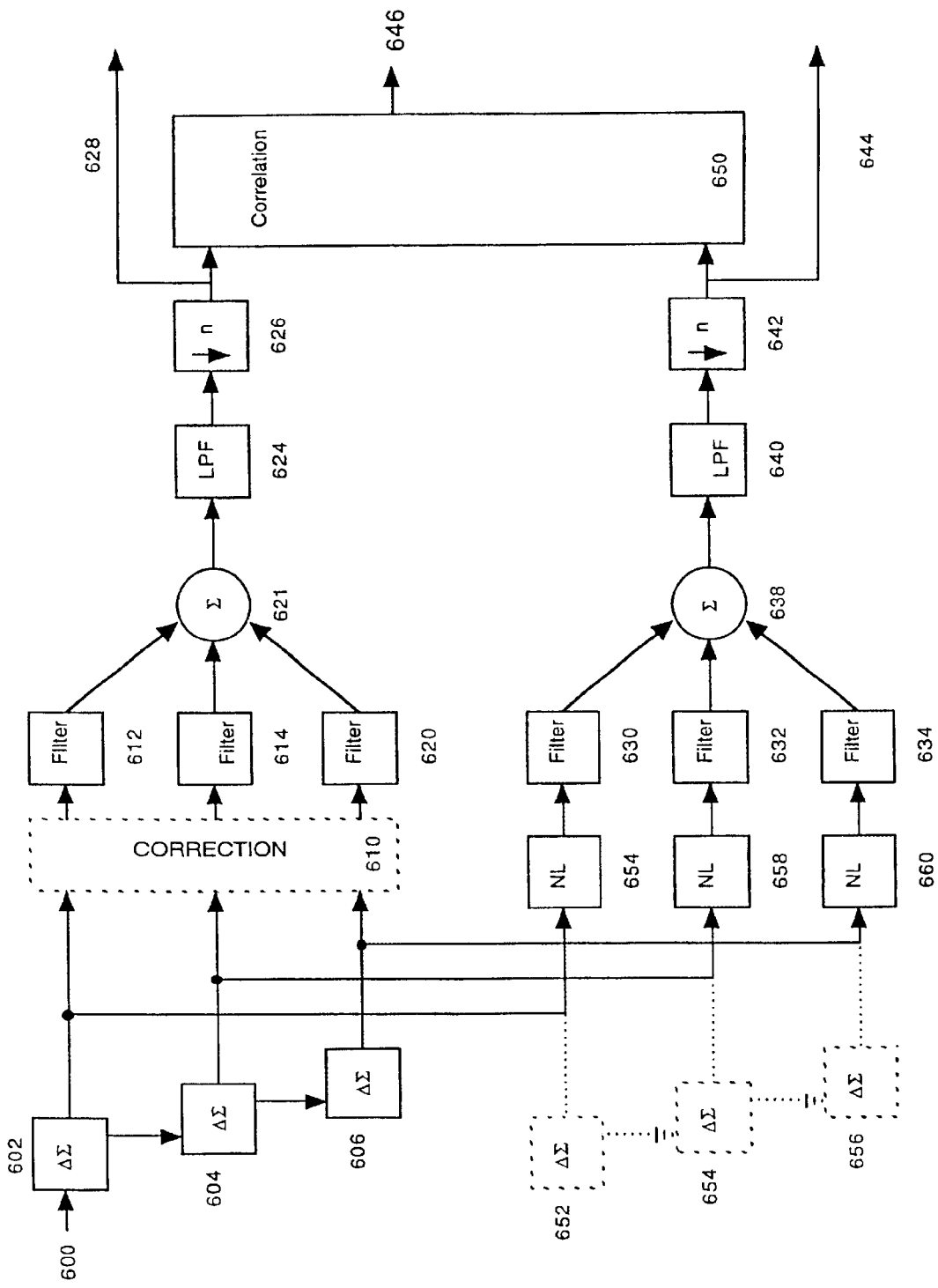
FIG. 6 shows a block diagram of a MASH ADC with error measurement and correction according to the present invention.

FIG. 6 shows a block diagram of a MASH ADC with error measurement and correction according to the present invention. A stereo system is shown, but the relevant elements of the second path (blocks 630, 632, 634, 638, 640 and 642) may be added to a chip for test purposes in a non stereo system or if convenient. Delta sigma ADCs 602, 604, and 606 are cascaded in a typical MASH configuration, with input signal 600 feeding the first ADC, 602. In measurement mode, correction block 610 is not present. the outputs from ADCs 602, 604, and 606 are applied to filter elements 612, 614, and 620 and the results added by adder 621. Filtering 624 and decimation 626 are applied and the result fed to correlation block 650. Signal 628 (and 644 in the stereo case) is the conventional output signal of the MASH given a real time input signal.

In the test path, the outputs of ADC's 602, 604, and 606 are applied to nonlinear elements 654, 658, and 660, and the results are applied to filter elements 630, 632, and 634 and the results added by adder 638. Filtering 640 and decimation 642 are applied and the result fed to correlation block 650.

Correlation block 650 correlates the two signals to find the error isolated by nonlinear blocks 654, 658, and 660. In correction mode (if used) the correlation block is not present, and delta sigma ADC's 652, 654, and 656 are in place. Correction block 610 applied the compensation factors measured in test mode. The kinds of errors corrected include gain and filtering mismatch which are the limiting factors in MASH ADC design. See Chapter 6 of Norsworthy for a discussion of this class of circuits. It is also possible to adjust filter 612, 614, 620 to have proper responses to compensate for imperfections in delta sigma ADC's 602, 604, 606.

Figure 7:
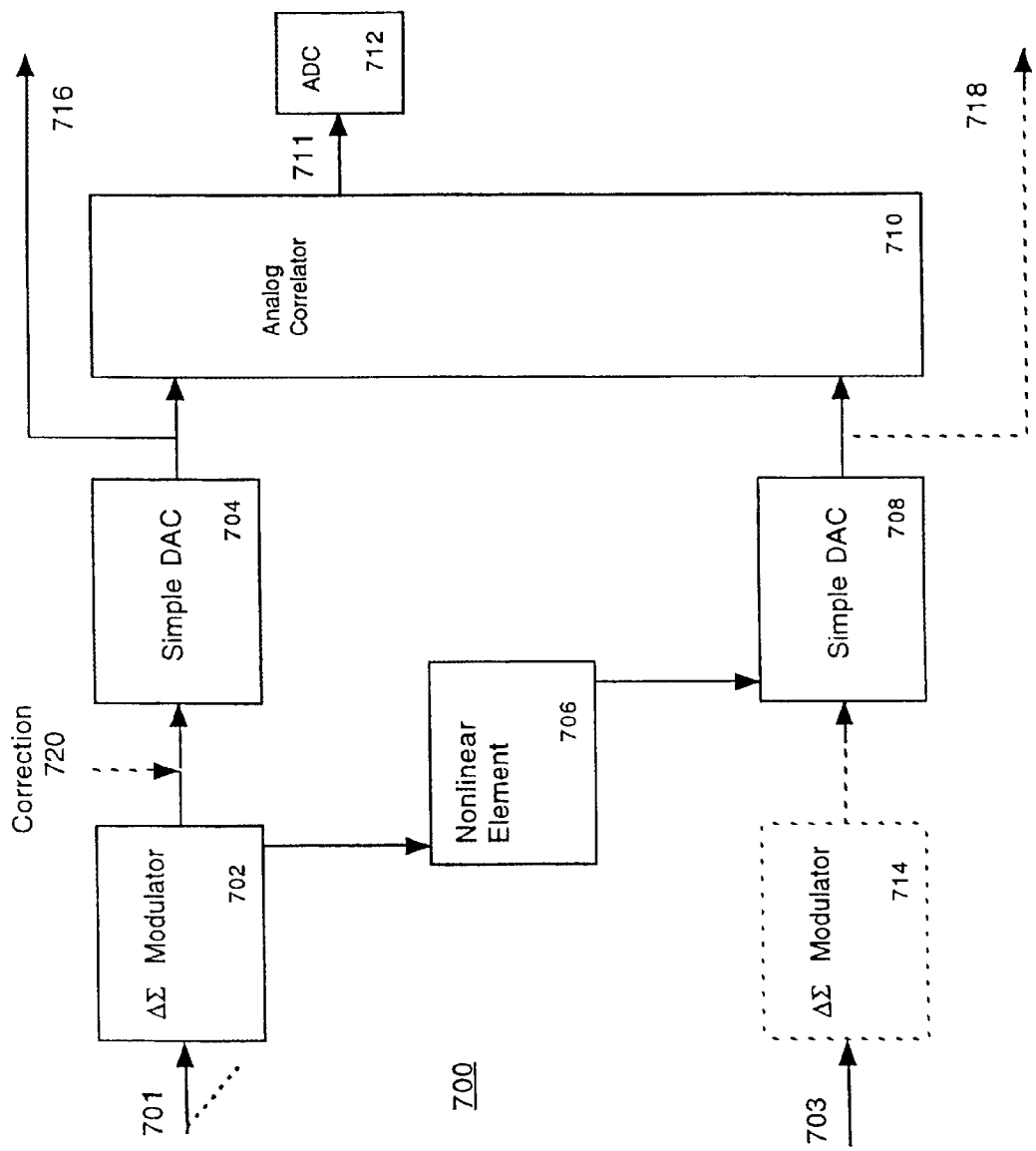
FIG. 7 shows a block diagram of a generalized stereo DAC according to the present invention including a nonlinear test element in one path and correlation of the noise through the usual path and through the nonlinear element.
Figure 8:
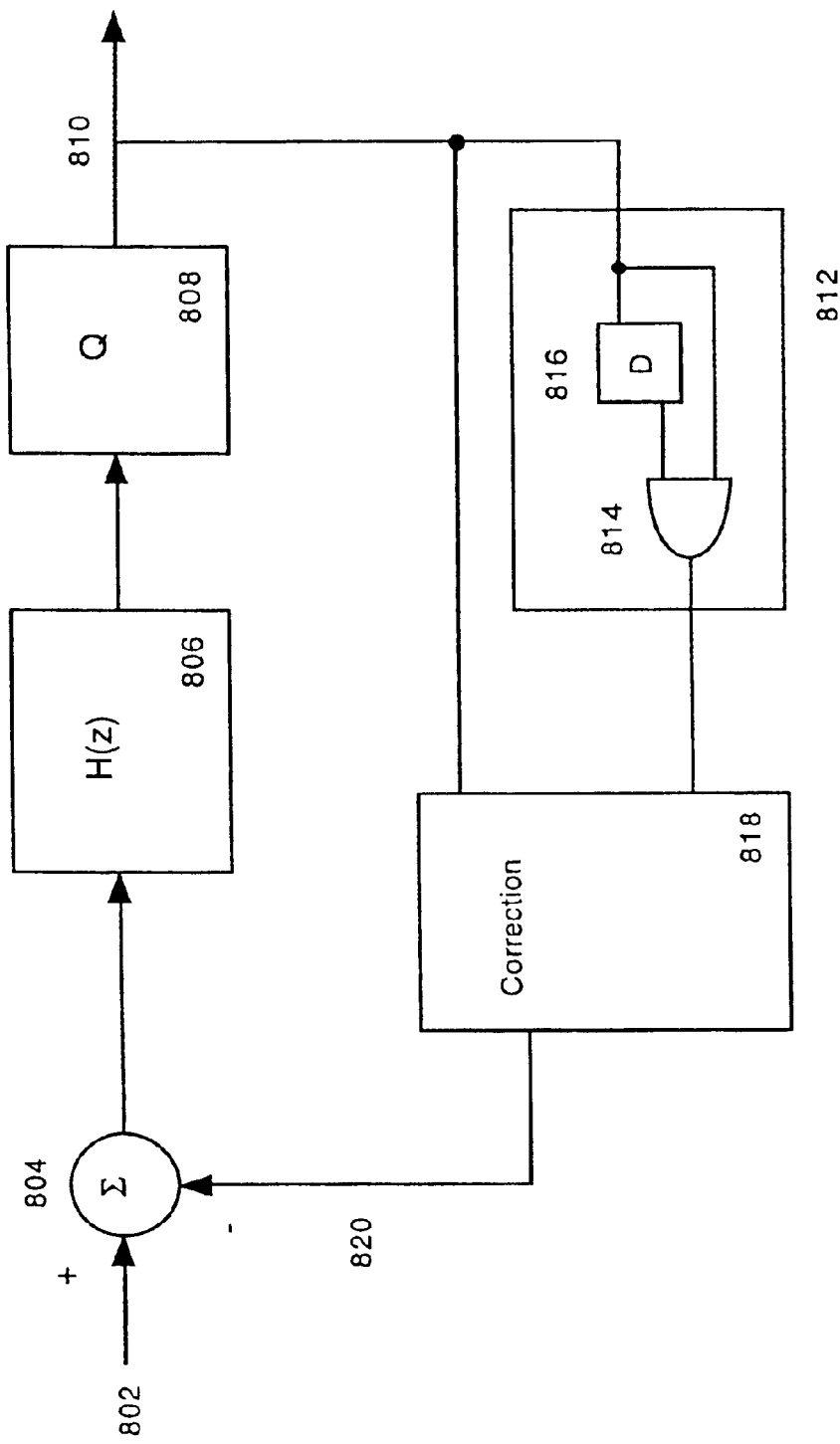
FIG. 8 shows a method of correcting intersymbol interference involving correction of the feedback path of the delta sigma DAC of FIG. 7.

FIG. 7 shows a block diagram of a generalized delta sigma DAC according to the present invention. Modulator 714 is present in the stereo case. Nonlinear test element 706 is inserted in one path and correlation of the noise through the usual path and through the nonlinear element path is accomplished. As in the case of the ADC circuits, one of the delta sigma modulators 714 is disconnected for the test mode, and the output of the other modulator 702 provides the input for the usual path (comprising a simple DAC 704 such as a PWM or a 1-bit DAC), as well as through the nonlinear element 706 and the simple DAC 708 from the other path. The outputs of both simple DACs 704, 708 are correlated by an analog correlator to measure the isolated error. Signals 716 and/or 718 are the conventional output(s) of the delta sigma DAC. Correction may be applied in real time, in a similar manner to that shown in FIG. 3. In the stereo case, nonlinear element 706 is disabled and modulator 714 is connected to simple DAC 708. In the mono case, modulator 714 is not present. FIG. 8 shows one method of correcting modulator 702 for simple intersymbol interference.

FIG. 8 shows a method of correcting the delta sigma DAC of FIG. 7 involving correction of the feedback path of modulator 702. This example shows how intersymbol interference ISI might be corrected in the feedback. If the error occurs only when a 1 follows a 1, then a method of controlling the correction which includes state must be used. For example, a flipflop 816 combined with an AND gate 814 will produce a 1 output only when a 1 follows a 1 on the input. This signals the correction block 818 to apply a correction factor to the feedback. This simple example of correction of one type of intersymbol interference is illustrative only. Obviously, more than two data points in a row may be examined to determine the proper correction factor, for example.

In higher order delta sigma DACs, different feedback correction may be applied to different feedback loops, as described in U.S. Pat. No. 5,815,102 and U.S. patent application Ser. No. 09/163,235.

Figure 9:
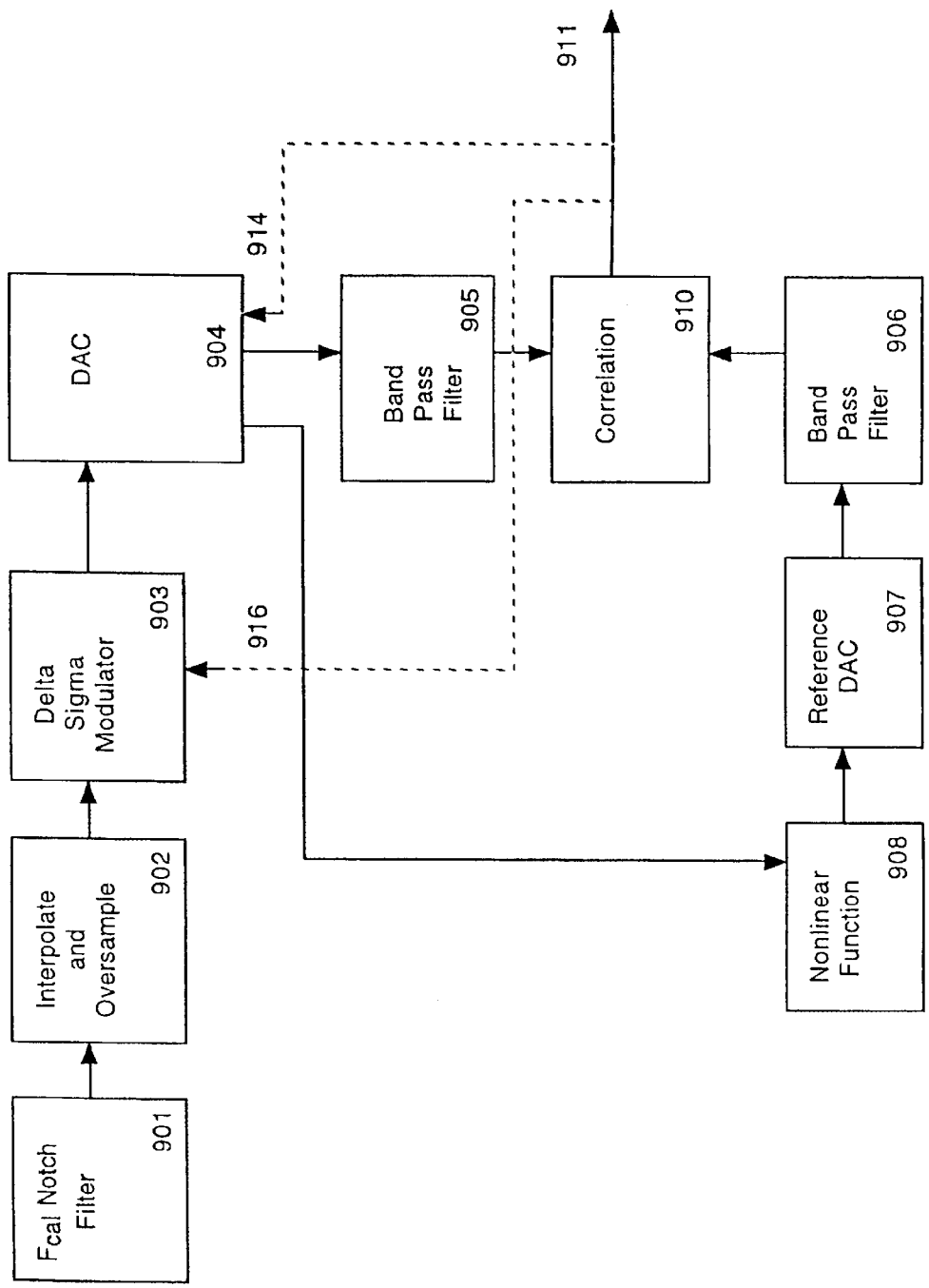
FIG. 9 is a block diagram of a preferred embodiment of continuous calibration circuitry according to the present invention.

FIG. 9 is a block diagram of a preferred embodiment of continuous calibration circuitry according to the present invention. This useful configuration of the calibration mode allows for continuous calibration while the converter is in normal operation. A frequency outside of the normal band of interest is chosen as a calibration frequency, e.g. fcal. Audio processing block 901 applies a notch filter to guarantee that there is minimal signal energy in that frequency band. The preferred choice of fcal for a digital audio system would be the Nyquist frequency, fs/2, as it is natural to create a signal that has no energy in that band. Block 902 increases the sampling rate to that of the delta sigma modulator, and keeps (or enhances) the notch at fcal. Delta sigma modulator block 903 is designed such that it generates very little noise energy at fcal. This is accomplished by placing a noise transfer function zero at fcal. This selection of zero frequency slightly sacrifices converter performance, but reduces out of band noise, and is a reasonable compromise. In this configuration, noise in the area of fcal is due only to output stage imperfections, and can be measured while the converter is in normal operation. The reference path includes nonlinear function 908 and reference digital to analog converter (DAC) 907 matched to DAC 904, and operates as described in conjunction with the other embodiments. Band pass filters 905 and 906 isolate the testing band. The error signal provided by correlator 910 may be applied as a correction signal 914, for modifying the performance of DAC 904, or as a correction signal 916, for modifying the performance of delta sigma modulator 903.

As an example, assume that a audio band D/A conversion is desired, and that a multilevel quantizer architecture is chosen. Sample rate of the input is 44100 Hz. A fifth order modulator is appropriate, with a single real zero at DC and complex pairs at 15 kHz and 22 kHz. The output of the modulator is 5 bits, and selects 0–31 current sources to be summed for the analog output. Distortion will be limited because of the mismatch of these current sources. The nonlinear element selects one of these output elements, and a correlation of the noise at 22050 Hz is performed. Any noise at this frequency is assumed to be due to element mismatch, and the correlation determines the magnitude of the mismatch. The mismatch can now be corrected, either by digital means in the feedback loop, or by the trimming of the appropriate element. This calibration can happen continuously, without interrupting the normal operation of the data converter.

Figure 10:
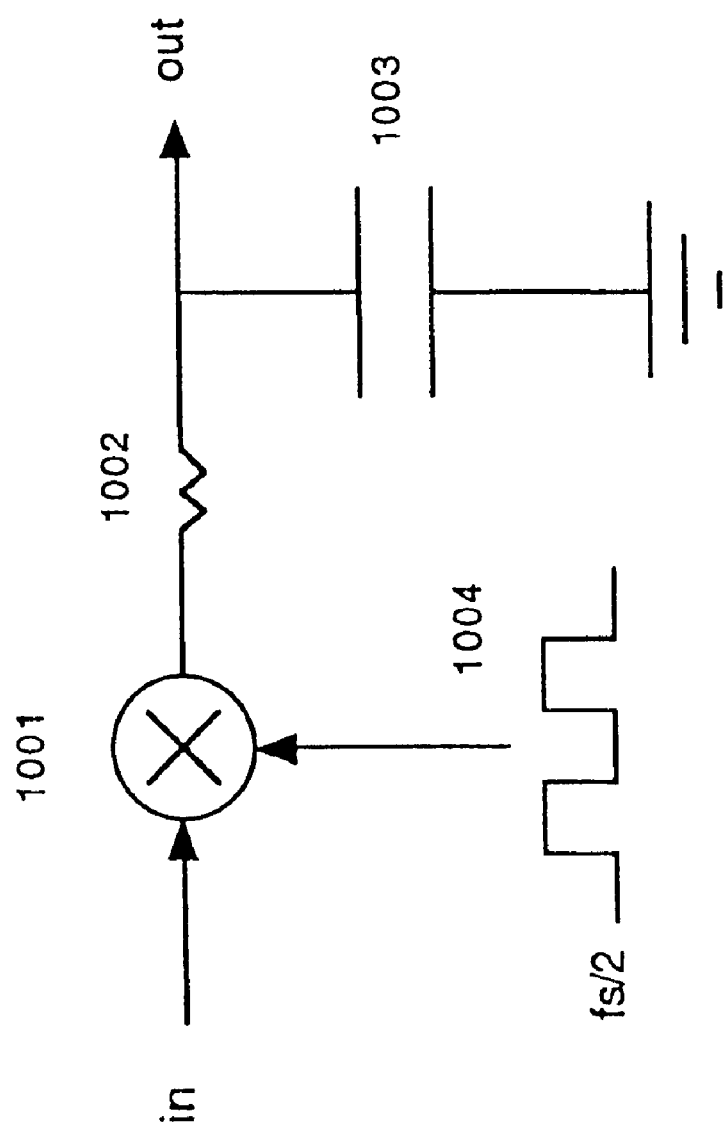
FIG. 10 is a block diagram of an embodiment of the band pass filters of FIG. 9.

FIG. 10 is a block diagram of one embodiment of the band pass filters of FIG. 9. If the Nyquist frequency of the converter input stream is used as fcal, the implementation of the band pass filter is very simple, and consists of multiplying the input by fs/2 square wave 1004 using multiply 1001, and filtering with a simple low pass filter, comprising resistor 1002 and capacitor 1003. The same approach can be used in an A/D converter as well.

Figure 11:
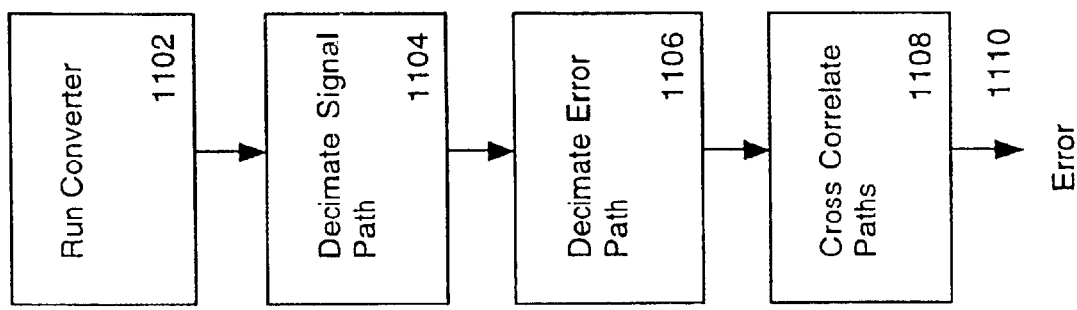
FIG. 11 is a flow diagram summarizing the performance of a simulation program provided as an Appendix.

FIG. 11 is a flow diagram summarizing the performance of the simulation program shown in FIG. 12, which illustrates the calibration and compensation method of the present invention. As the delta sigma converter run in step 1102, the signal path is decimated in step 1104, the error path is decimated in step 1106, and the two paths are correlated in step 1108. The result of this correlation is the error signal e, and is used to correct the circuit as described in various places above.

While the exemplary preferred embodiments of the present invention are described herein with particularity, those skilled in the art will appreciate various changes, additions, and applications other than those specifically mentioned, which are within the spirit of this invention.

What is claimed is:

1. Apparatus for measuring circuit imperfections in an analog to digital converter (ADC) including an analog delta sigma modulator, the apparatus comprising:

a first decimator connected to the output of the modulator;

a nonlinear test element connected to the output of the modulator, for applying a nonlinear function to the output of the modulator;

a second decimator matched to the first decimator and connected to the output of the nonlinear element;

a correlator connected to the output of the first decimator and the output of the second decimator; and means for applying a test signal to the ADC;

wherein the correlator performs a correlation between the output of the first decimator and the output of the second decimator in the presence of the test signal and generates a circuit error signal based upon the correlation.

2. The apparatus of claim 1, further comprising:

means for applying a correction factor, based upon the circuit error signal, to the output of the ADC; and means for applying an input signal to the input of the ADC.

3. The apparatus of claim 2, wherein the correction factor applying means comprises means for trimming a circuit element in the ADC.

4. The apparatus of claim 2, wherein the correction factor applying means comprises a correction block connected between the modulator and the first decimation filter for correcting the output of the ADC according to the circuit error signal.

5. The apparatus of claim 1 used to measure intersymbol interference, wherein the nonlinear element outputs a predetermined signal only when the output of the modulator, in the presence of the test signal, supplies a predetermined pattern.

6. The apparatus of claim 1, wherein the delta sigma modulator is multilevel and includes a digital to analog converter (DAC) in the feedback path, the apparatus used to measure mismatch in components associated with each level in the DAC, the apparatus comprising:

a swap control element in the DAC for selectively swapping elements in the DAC associated with each level in order to test all of the levels.

7. The apparatus of claim 6, further comprising:

means for applying a correction factor, based upon the circuit error signal, to the output of the ADC; and means for applying a signal to the input of the ADC.

8. The apparatus of claim 7, wherein the correction factor applying means comprises means for trimming elements in the DAC.

9. The apparatus of claim 7, wherein the correction factor applying means comprises a correction block connected between the modulator and the first decimation filter.

10. Apparatus for measuring circuit imperfections in an analog to digital converter (ADC) including at least two analog delta sigma modulators connected to inputs of the ADC, the apparatus comprising:

a first decimator connected to the output of the first modulator;

a nonlinear test element connected to the output of the first modulator, for applying a nonlinear function to the output of the first modulator;

a second decimator matched to the first decimator and connected to the output of the nonlinear element;

a correlator connected to the output of the first decimator and the output of the second decimator; and means for applying a test signal to the ADC;

wherein the correlator performs a correlation between the output of the first decimator and the output of the second decimator in the presence of the test signal and generates a circuit error signal based upon the correlation.

11. The apparatus of claim 10, further comprising:

means for disabling the nonlinear element;

means for connecting the second decimator to the output of the second modulator;

means for applying a correction factor, based upon the circuit error signal, to an output of the ADC; and means for applying input signals to the inputs of the ADC.

12. The apparatus of claim 11, wherein the correction factor applying means comprises means for trimming a circuit element in the ADC.

13. The apparatus of claim 11, wherein the correction factor applying means comprises a correction block connected between the first modulator and the first decimation filter.

14. The apparatus of claim 10 used to measure intersymbol interference, wherein the nonlinear element outputs a predetermined signal only when the output of the first modulator, in the presence of the test signal, supplies a predetermined pattern.

15. The apparatus of claim 10, wherein the first delta sigma modulator is multilevel and includes a digital to analog converter (DAC) in the feedback path, the apparatus used to measure mismatch in components associated with each level in the DAC, the apparatus comprising:

a swap control element in the DAC for selectively swapping elements in the DAC associated with each level in order to test all of the levels.

16. The apparatus of claim 15, further comprising:

means for applying a correction factor, based upon the circuit error signal, to the output of the ADC; and means for applying a signal to the input of the ADC.

17. A method of measuring circuit imperfections in a delta sigma analog to digital converter (ADC) including an analog delta sigma modulator, the method comprising the steps of:

applying a nonlinear function to the output of the modulator;

performing a correlation between the output of the modulator and the output of the modulator after the nonlinear function is applied; and generating a circuit error signal based upon the correlation.

18. The method of claim 17, further comprising the step of correcting the output of the ADC according to the circuit error signal.

19. The method of claim 18, wherein the test signal is a signal out of the frequency of interest of the ADC, and the steps of generating a circuit error signal and correcting the output of the ADC are repeated as the ADC operates.

20. The method of claim 18, wherein the step of generating the circuit error signal is performed once, and the step of correcting the output of the ADC according to the circuit error signal occurs as the ADC operates.

21. The method of claim 18, wherein the step of generating the circuit error signal is performed at selected times, and the step of correcting the output of the ADC according to the circuit error signal occurs as the ADC operates.

* * * * *